(12) United States Patent
Lum et al.

(10) Patent No.: US 12,500,186 B2
(45) Date of Patent: Dec. 16, 2025

(54) CAPACITOR HAVING ELECTRODES FORMED WITHIN A SUBSTRATE

(71) Applicant: Micron Technology, Inc., Boise, ID (US)

(72) Inventors: Wen Wei Lum, Singapore (SG); Kelvin Aik Boo Tan, Singapore (SG); Alaa N. Ali, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 692 days.

(21) Appl. No.: 17/812,565

(22) Filed: Jul. 14, 2022

(65) Prior Publication Data

US 2024/0021545 A1 Jan. 18, 2024

(51) Int. Cl.

| | | |
|---|---|---|
| H01L 23/64 | (2006.01) | |
| H01L 21/48 | (2006.01) | |
| H01L 23/498 | (2006.01) | |
| H10D 1/68 | (2025.01) | |

(52) U.S. Cl.
CPC ........ H01L 23/642 (2013.01); H01L 21/4853 (2013.01); H01L 21/4857 (2013.01); H01L 23/49822 (2013.01); H01L 23/49838 (2013.01); H10D 1/692 (2025.01)

(58) Field of Classification Search
None
See application file for complete search history.

(56) References Cited

U.S. PATENT DOCUMENTS

| | | | |
|---|---|---|---|
| 11,393,801 B2* | 7/2022 | Shin | H01L 25/16 |
| 11,410,932 B2* | 8/2022 | Tseng | H01G 4/228 |
| 12,040,266 B2* | 7/2024 | Hsu | H01L 23/5226 |
| 12,094,891 B2* | 9/2024 | Krueger | H10F 39/191 |
| 2016/0155709 A1* | 6/2016 | Hamada | H01L 24/05 |
| | | | 257/532 |
| 2021/0013253 A1* | 1/2021 | Takase | H10D 84/00 |
| 2021/0118618 A1* | 4/2021 | Shin | H01L 25/16 |
| 2022/0352078 A1* | 11/2022 | Tseng | H01G 4/38 |

* cited by examiner

Primary Examiner — Long Pham
(74) Attorney, Agent, or Firm — Harrity & Harrity, LLP (57) ABSTRACT

Implementations described herein relate to various apparatuses and integrated assemblies. In some implementations, an apparatus may include a substrate having a first surface and a second surface that is on an opposite side of the substrate with respect to the first surface. The apparatus may include an integrated circuit disposed on the substrate. The apparatus may include a decoupling capacitor configured to stabilize an input voltage supplied to the integrated circuit, wherein all electrodes of the decoupling capacitor are entirely within a region between the first surface and the second surface.

27 Claims, 9 Drawing Sheets

CAPACITOR HAVING ELECTRODES FORMED WITHIN A SUBSTRATE

TECHNICAL FIELD

The present disclosure generally relates to semiconductor devices and methods of forming semiconductor devices. For example, the present disclosure relates to a capacitor having electrodes formed within a substrate.

BACKGROUND

A semiconductor package includes a casing that contains one or more semiconductor devices, such as integrated circuits. Semiconductor device components may be fabricated on semiconductor wafers before being diced into die and then packaged. A semiconductor package protects internal components from damage and includes means for connecting internal components to external components (e.g., a circuit board), such as via balls, pins, or leads. A semiconductor package is sometimes referred to as a semiconductor device assembly.

DETAILED DESCRIPTION

A capacitor, such as a decoupling capacitor, may be coupled with an integrated circuit within a semiconductor package. A decoupling capacitor may be used to keep an input voltage to the integrated circuit relatively stable (e.g., compared to an integrated circuit that is not coupled with a decoupling capacitor). For example, if the input voltage is higher than an operating voltage of the integrated circuit, then the decoupling capacitor can provide a low impedance path for discharging excess voltage. If the input voltage is lower than an operating voltage of the integrated circuit, then the decoupling capacitor can supply additional voltage via charge stored in the decoupling capacitor.

Typically, a decoupling capacitor is a discrete component that is mounted to a surface of a substrate on which the integrated circuit is also mounted. However, a surface-mounted discrete component occupies space beyond the surfaces of the substrate, which results in a larger semiconductor package due to the height of the surface-mounted discrete component. Furthermore, surface area on a surface of the substrate must be allocated to the surface-mounted discrete component, which may further increase a surface area and therefore a size of the semiconductor package. As a result of the increased height and/or surface area, the semiconductor package may not comply with size limitations required for use of the semiconductor package within a system. Additionally, when a discrete component is surface-mounted to a substrate, there are restrictions on where the discrete component can be placed due to the presence of other components, such as integrated circuits, other discrete components, traces, bond pads, or the like. In the case of a decoupling capacitor, this limitation on placement may result in the decoupling capacitor being placed farther from the integrated circuit to which the decoupling capacitor is coupled, which reduces the effectiveness of the decoupling capacitor for supplying extra voltage to or discharging excess voltage from the integrated circuit (e.g., due to a longer time being required for charge to travel between the decoupling capacitor and the integrated circuit).

Some implementations described herein relate to a capacitor, such as a decoupling capacitor, having electrodes formed within a substrate. For example, a first set of via stacks may extend from a primary (e.g., top) layer of the substrate to a first inner layer of the substrate, and a second set of via stacks may extend from a secondary (e.g., bottom) layer of the substrate to a second inner layer of the substrate. These via stacks may form electrodes of the capacitor and may be separated from one another by dielectric material (e.g., a material capable of being polarized and/or capable of storing electric charge), such as a core of the substrate and/or pre-impregnated material. The first set of via stacks may be coupled to an integrated circuit, which may be mounted on the substrate, via a power plane that acts as a first terminal of the capacitor. The second set of via stacks may be coupled to the integrated circuit via a ground plane that acts as a second terminal of the capacitor.

Because the capacitor described herein has electrodes that are within the substrate, the capacitor does not occupy any space beyond the surfaces of the substrate. As a result, a height of the semiconductor package is reduced, and a surface area of the substrate may be reduced. These reductions in height and surface area may reduce a size of the semiconductor package (and other associated structures, assemblies, and apparatuses), which uses less material, enables compliance with size limitations, and reduces cost as compared to a discrete capacitor that is formed separately from the substrate. Furthermore, forming a decoupling capacitor in this way may enable greater flexibility in the placement of the capacitor, which may allow the decoupling capacitor to be placed closer to the integrated circuit as compared to a discrete decoupling capacitor, which increases the effectiveness of the decoupling capacitor for supplying extra voltage to or discharging excess voltage from the integrated circuit (e.g., due to a shorter time being required for charge to travel between the decoupling capacitor and the integrated circuit). Furthermore, a capacitance of the capacitor may be easily controlled by modifying a manner in which the capacitor is formed, such as by forming the capacitor with a particular quantity of via stacks, a particular spacing between via stacks, a particular thickness of one or more layers of the substrate, or the like. In some implementations, the capacitor described herein may be used in a semiconductor package having a voltage rail (e.g., a 2.5V rail, a 1.8V rail, a 1.2V rail, or a 0.8V rail) that requires a capacitor having a capacitance of 1 microfarad.

Figure 1:
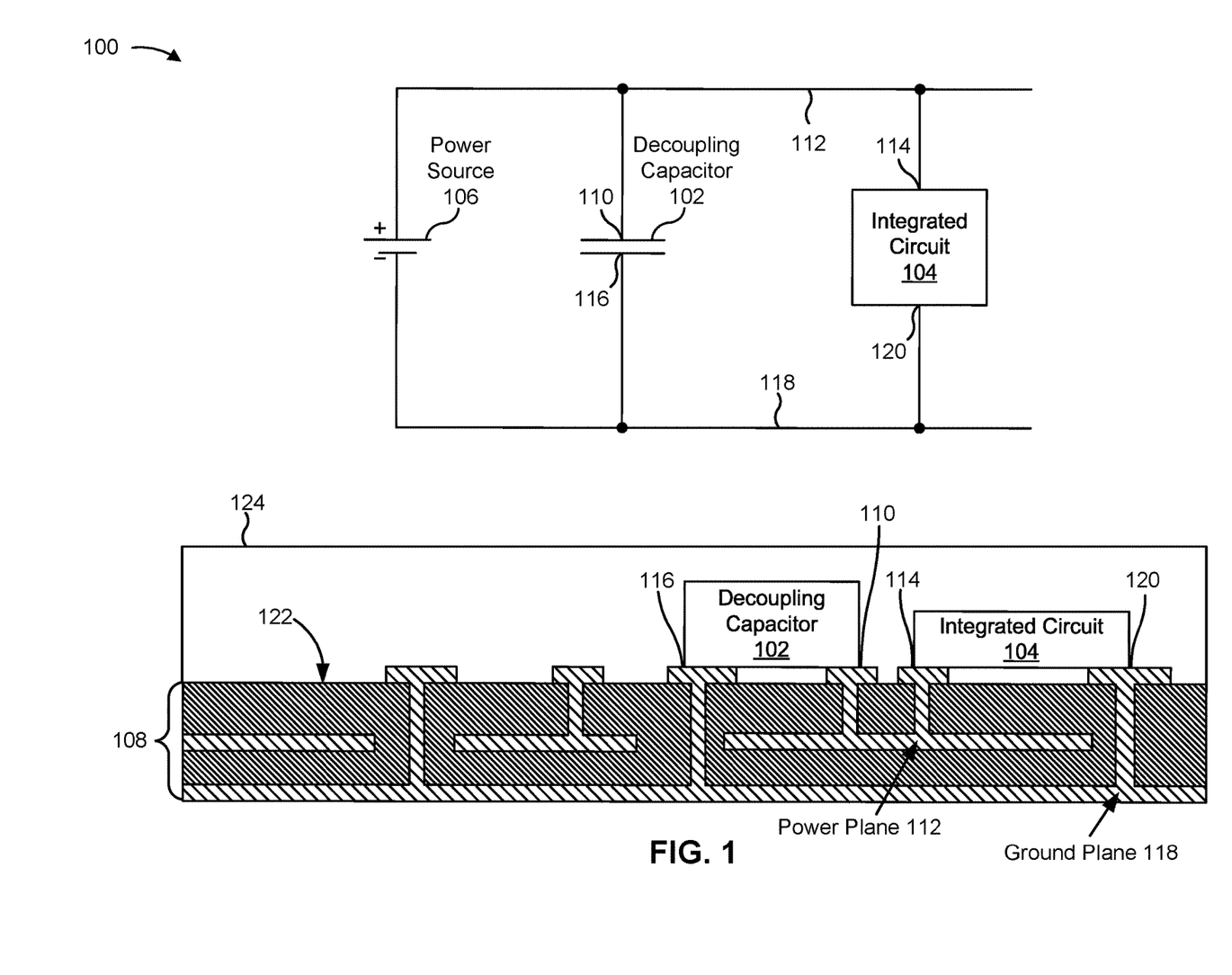
FIG. 1 is a diagram of an example system that includes a decoupling capacitor.

FIG. 1 is a diagram of an example system 100 that includes a decoupling capacitor 102. As shown, the decoupling capacitor 102 may be coupled with an integrated circuit 104. For example, the decoupling capacitor 102 and the integrated circuit 104 may be connected in parallel to a power source 106. The integrated circuit 104 may be powered by the power source 106.

In some cases, the integrated circuit 104 may require a relatively stable input voltage to operate correctly, such as an input voltage that is within a tolerance range. However, the input voltage received by the integrated circuit 104 (e.g., from the power source 106) may vary due to one or more factors, such as glitches, voltage spikes, variations in alternating current, an amount of power drawn by other components from the power source 106, a variation over time in the amount of power drawn by those other components, or the like. The decoupling capacitor 102 may reduce the variation in input voltage received by the integrated circuit 104 and may assist with providing a relatively stable input voltage to the integrated circuit 104. For example, if the input voltage is higher than an operating voltage of the integrated circuit 104, then the decoupling capacitor 102 can provide a low impedance path for discharging excess voltage. If the input voltage is lower than an operating voltage of the integrated circuit 104, then the decoupling capacitor 102 can supply additional voltage via charge stored in the decoupling capacitor 102.

As shown, in some cases, the decoupling capacitor 102 and the integrated circuit 104 may be mounted on a substrate 108. A first terminal 110 of the decoupling capacitor 102 may be coupled with a power plane 112 integrated with the substrate 108. The power plane 112 may be coupled with a power pin 114 of the integrated circuit 104. The power plane 112 may electrically couple various components, such as the decoupling capacitor 102 and the integrated circuit 104, with the power source 106 (e.g., a positive terminal of the power source 106). Similarly, a second terminal 116 of the decoupling capacitor 102 may be coupled with a ground plane 118 integrated with the substrate 108. The ground plane 118 may be coupled with a ground pin 120 of the integrated circuit 104. The ground plane 118 may electrically couple various components, such as the decoupling capacitor 102 and the integrated circuit 104, with ground (e.g., a negative terminal of the power source 106).

In FIG. 1, the decoupling capacitor 102 is shown as a discrete component that is mounted to a surface 122 of the substrate 108. As a result, the height and size of a semiconductor package 124 containing the decoupling capacitor 102, the integrated circuit 104, and the substrate 108 is larger than if the decoupling capacitor 102 were not mounted on the surface 122 of the substrate 108. Furthermore, surface area on the surface 122 of the substrate 108 is allocated to the decoupling capacitor 102, which may further increase a size of the semiconductor package 124. As a result of the increased size, the semiconductor package 124 may not comply with size limitations required for use of the semiconductor package 124 within a system. Additionally, there may be design restrictions when surface-mounting the decoupling capacitor 102 to the substrate 108, which may limit a location where the discrete component can be placed on the substrate 108 due to the presence of other components. These location limitations may result in the decoupling capacitor 102 being placed farther than desired from the integrated circuit 104, which reduces the effectiveness of the decoupling capacitor for supplying extra voltage to or discharging excess voltage from the integrated circuit 104. Some implementations described herein address these and other issues.

As indicated above, FIG. 1 is provided as an example. Other examples may differ from what is described with regard to FIG. 1.

Figure 2A:
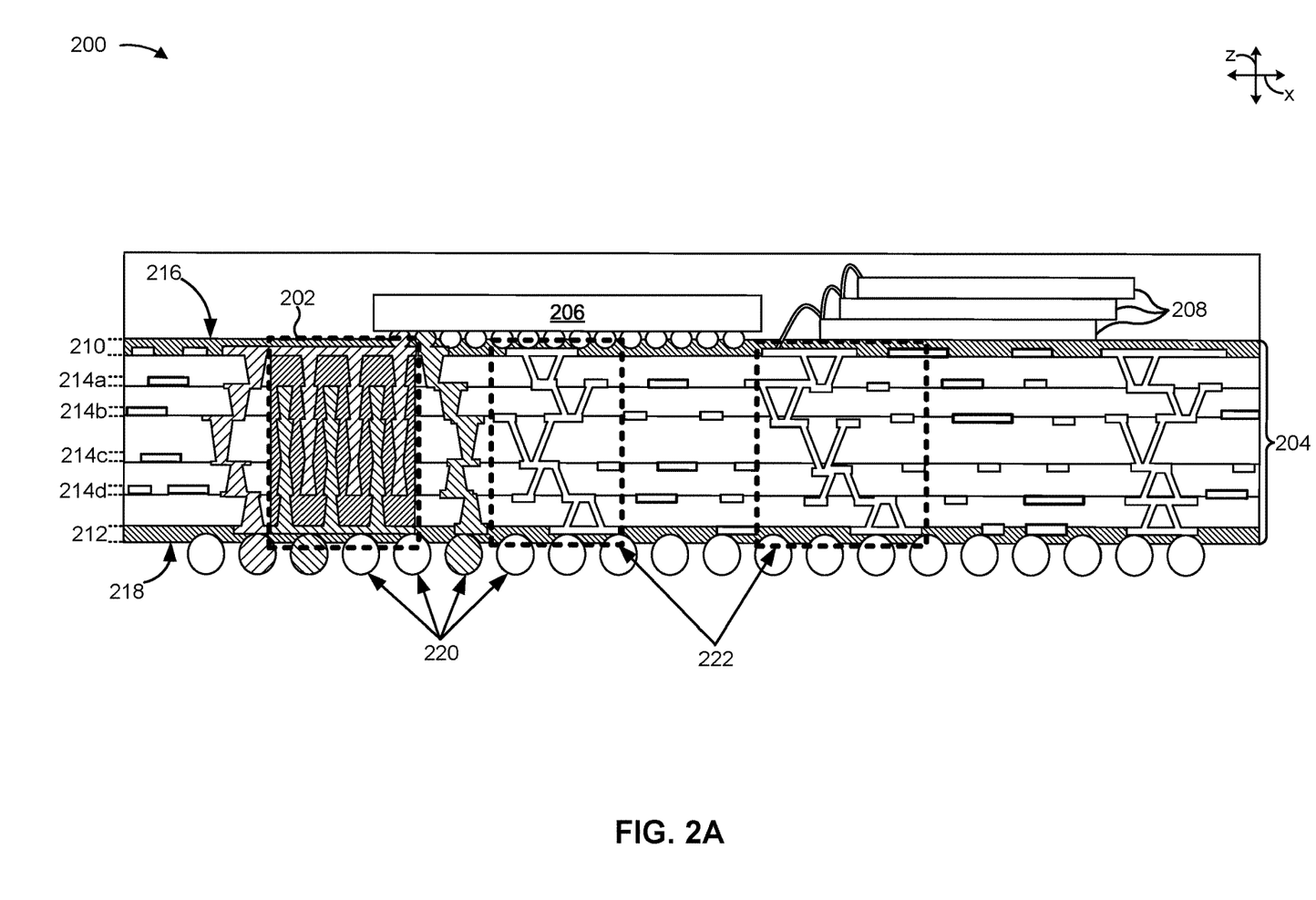
FIGS. 2A-2C are diagrams of an example apparatus that includes a capacitor having electrodes formed within a substrate.
Figure 2B:
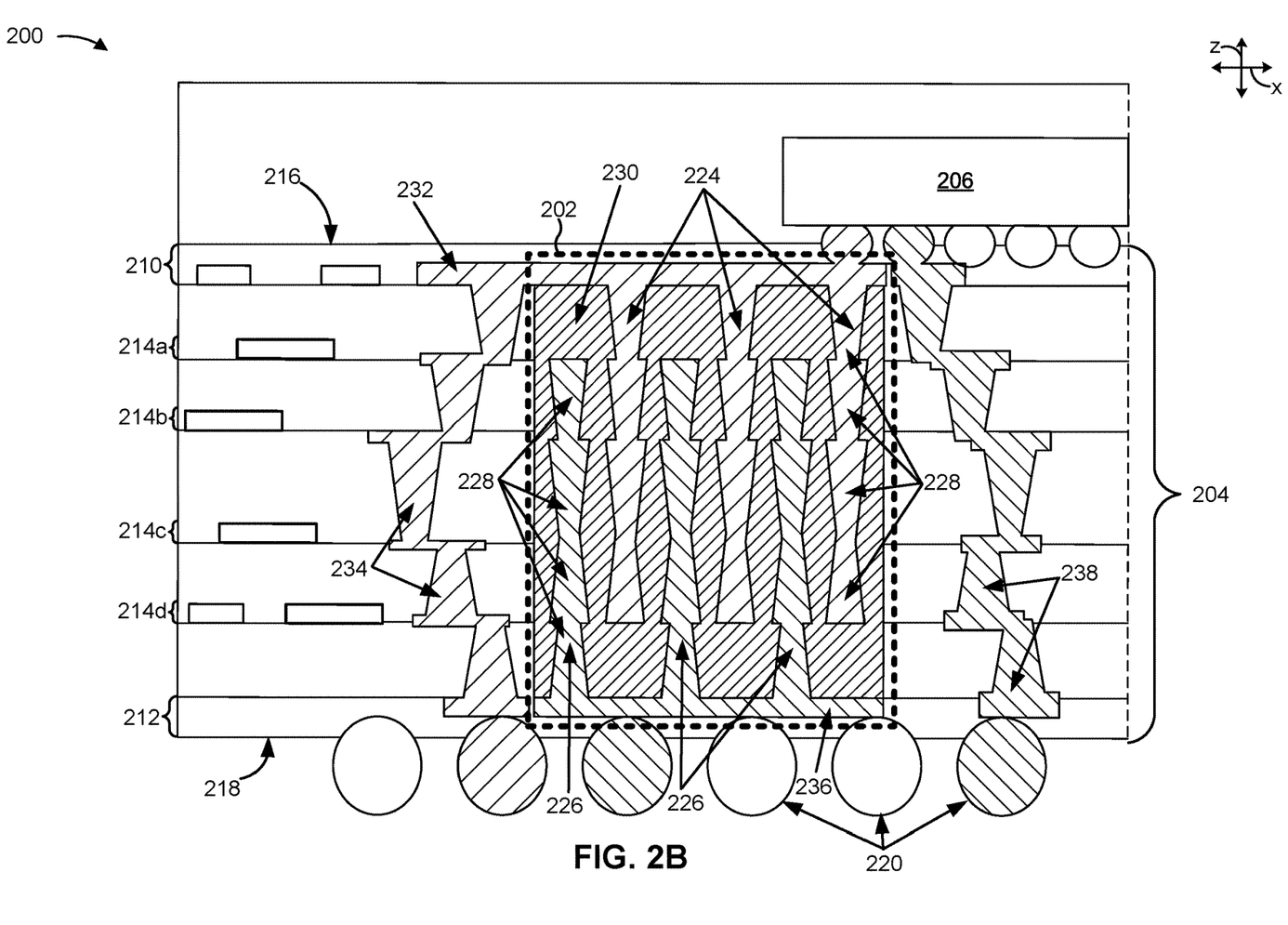
Figure 2C:
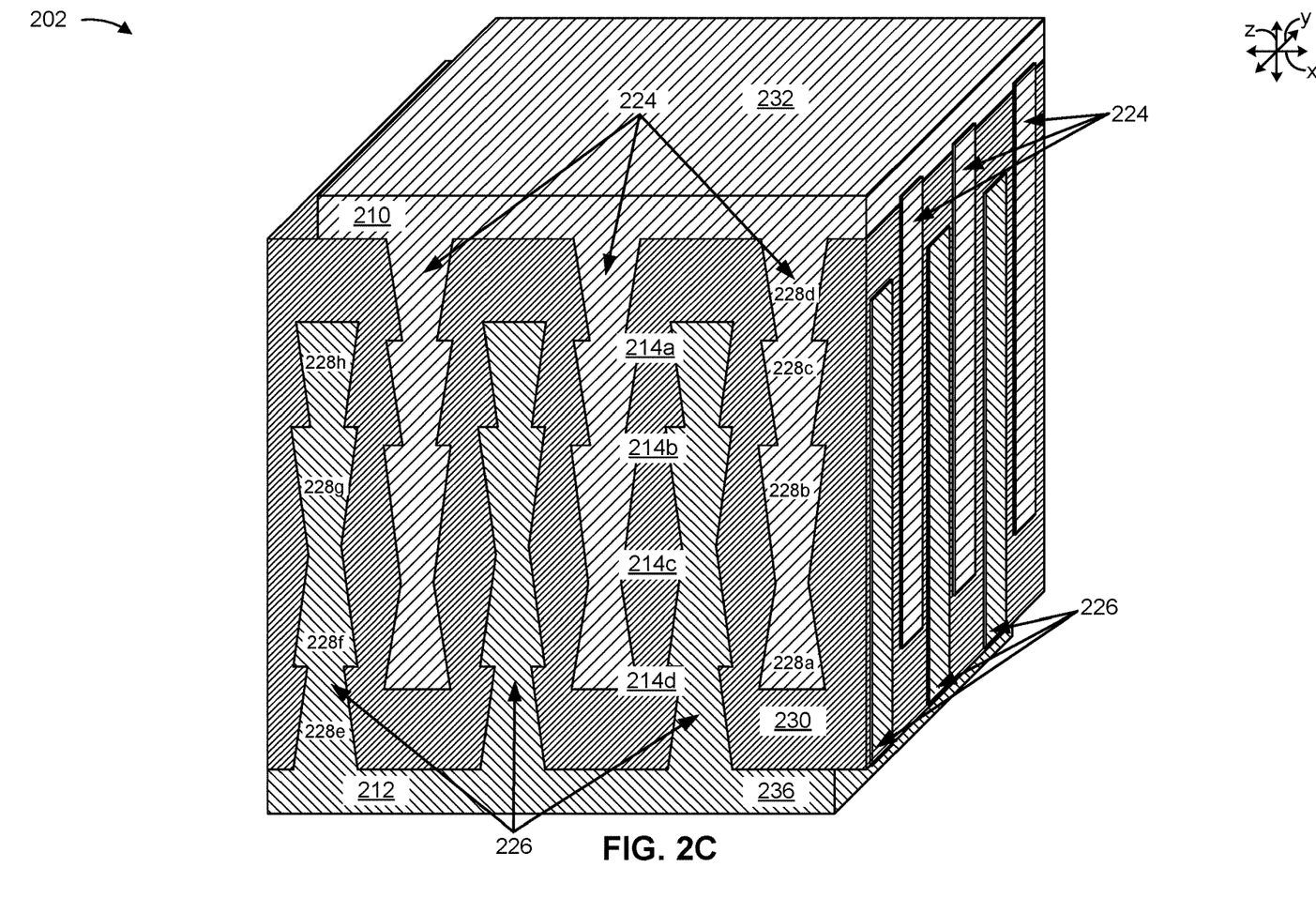

FIGS. 2A-2C are diagrams of an example apparatus 200 that includes a capacitor 202 having electrodes formed within a substrate 204. FIG. 2A shows a cross-sectional view of the apparatus 200. FIG. 2B shows an enlarged view of a portion of the cross-sectional view of FIG. 2A. FIG. 2C is a perspective view of the capacitor 202 of the apparatus 200. The apparatus 200 may include any type of device or system that includes one or more integrated circuits. For example, the apparatus 200 may include a memory device, a flash memory device, a NAND memory device, a NOR memory device, a random access memory (RAM) device, a read-only memory (ROM) device, a dynamic RAM (DRAM) device, a static RAM (SRAM) device, a solid state drive (SSD), a microchip, and/or a system on a chip (SoC). In some implementations, the apparatus 200 may include a common voltage rail (e.g., a 2.5V rail, a 1.8V rail, a 1.2V rail, or a 0.8V rail) that requires a decoupling capacitor having a capacitance of 1 microfarad. This level of capacitance may be provided by the capacitor 202 described herein.

As shown in FIG. 2A, the apparatus 200 may include an integrated circuit 206. The integrated circuit 206 may include any type of circuit, such as an analog circuit, a digital circuit, a radiofrequency (RF) circuit, a power supply, an input-output (I/O) chip, an application-specific integrated circuit (ASIC), a field-programmable gate array (FPGA), and/or a memory device (e.g., a NAND memory device, a NOR memory device, a RAM device, or a ROM device). In some implementations, the integrated circuit 206 may be mounted on or otherwise disposed on a surface of the substrate 204. Additionally, or alternatively, the integrated circuit 206 may be formed from the substrate 204, such that the integrated circuit 206 is partially or entirely within the substrate 204. In some implementations, the capacitor 202 is a decoupling capacitor coupled to the integrated circuit 206 and configured to stabilize an input voltage supplied to the integrated circuit 206 (e.g., by storing a charge), as described in detail above. In some implementations, the apparatus 200 may include one or more other components 208 mounted to the surface of the substrate, such as one or more semiconductor dies. In some cases, the apparatus 200 may be referred to as a semiconductor package, an assembly, a semiconductor device assembly, or an integrated assembly.

As shown in FIGS. 2A-2C, the substrate 204 may include a primary layer 210, a secondary layer 212, and one or more inner layers 214, shown as 214a, 214b, 214c, and 214d. As shown, the primary layer 210 may be the top layer of the substrate 204, and the secondary layer 212 may be the bottom layer of the substrate 204. The primary layer 210 and the secondary layer 212 may be on opposite sides of the substrate 204. For example, the primary layer 210 may be on as a first side (e.g., a top side) of the substrate 204, and the secondary layer 212 may be on a second side (e.g., a bottom side) of the substrate 204 that is opposite the first side. Thus, the secondary layer 212 may be on an opposite side of the substrate 204 with respect to the primary layer 210. The primary layer 210 may include a first surface 216 (e.g., a first external surface or a top surface) of the substrate 204, and the secondary layer 212 may include a second surface 218 (e.g., a second external surface or a bottom surface) of the substrate 204.

In some implementations, one or more components may be mounted on or disposed on the primary layer 210. For example, the integrated circuit 206 may be mounted on or disposed on the primary layer 210. In some implementations, the secondary layer 212 includes electrical contacts (e.g., pads) for mounting the apparatus 200 to another object, such as a printed circuit board. The electrical contacts on the secondary layer 212 may connect the devices of the apparatus 200, such as the capacitor 202 and the integrated circuit 206, to one or more other devices external from the apparatus 200, such as a power source. In some implementations, the electrical contacts of the secondary layer 212 may be coupled to respective solder balls 220, such as in a ball grid array (BGA).

The inner layers 214 may be between the primary layer 210 and the secondary layer 212. In some implementations, multiple inner layers 214 are stacked on one another. In some implementations, dielectric material (e.g., a substrate core and/or pre-impregnated material, described in more detail below) may be between the inner layers 214, may be between the primary layer 210 and an inner layer 214a adjacent to the primary layer 210, and/or may be between the secondary layer 212 and an inner layer 214d adjacent to the secondary layer 212. Although the example apparatus 200 shown in FIGS. 2A-2C includes four inner layers 214, the apparatus 200 may include a different number of inner layers 214 in some implementations, such as one inner layer 214, two inner layers 214, three inner layers 214, five inner layers 214, six inner layers 214, and so on. The inner layers 214 may include various vias (e.g., conductive vias), traces (e.g., patterned traces), or other conductive material to route signals between various components of the apparatus 200 and/or to route signals to or from those components and external components. For example, as shown by reference number 222, a component of the apparatus 200 (e.g., the integrated circuit 206 and/or another component 208) may be coupled with an external component via an electrical contact on the primary layer 210, a respective via through each inner layer 214, connections between vias on adjacent inner layers 214, an electrical contact on the secondary layer 212, and a solder ball 220 (which may be melted to form a physical and electrical connection between separate electrical devices). In some cases, as is shown by reference number 222, the vias on each inner layer 214 may not be vertically aligned (e.g., may be horizontally offset from one another), such that the vias need to be connected by traces or other conducive material on the inner layers 214.

As further shown in FIGS. 2A-2C, the capacitor 202 may include multiple electrodes, such as a first plurality of electrodes 224 and a second plurality of electrodes 226. In some implementations, all of the electrodes of the capacitor 202 (e.g., every electrode included in the first plurality of electrodes 224 and every electrode included in the second plurality of electrodes 226) are entirely within a region between the first surface 216 and the second surface 218. In other words, the electrodes of the capacitor 202 may be located or positioned entirely within the substrate 204. This enables a size of the apparatus 200 to be reduced as compared to a discrete and/or surface-mounted capacitor, and enables the capacitor 202 to be positioned closer to the integrated circuit 206 than a discrete and/or surface-mounted capacitor, as described elsewhere herein.

The term "primary electrode" may be used herein to refer to an electrode 224 included in the first plurality of electrodes 224. The term "secondary electrode" may be used herein to refer to an electrode 226 included in the second plurality of electrodes 226. As shown, each primary electrode 224 extends from the primary layer 210 through one or more inner layers 214, shown as inner layers 214a, 214b, 214c, and 214d. Each primary electrode 224 extends toward the secondary layer 212, but does not extend to the secondary layer 212 (e.g., to prevent electrical shorting). Similarly, each secondary electrode 226 extends from the secondary layer 212 through one or more inner layers 214, shown as inner layers 214a, 214b, 214c, and 214d. Each secondary electrode 226 extends toward the primary layer 210, but does not extend to the primary layer 210 (e.g., to prevent electrical shorting).

The secondary electrodes 226 may extend through a different combination of inner layers 214 than the primary electrodes 224. For example, the primary electrodes 224 may extend from the primary layer 210 to an inner layer 214d (e.g., a first inner layer), and the secondary electrodes 226 may extend from the secondary layer 212 to an inner layer 214a (e.g., a second inner layer). In some implementations, the primary electrodes 224 may extend from the primary layer 210 to an inner layer 214d that is adjacent to the secondary layer 212. Similarly, the secondary electrodes 226 may extend from the secondary layer 212 to an inner layer 214a that is adjacent to the primary layer 210. In this way, a capacitance of each electrode may be maximized (e.g., by maximizing a length or height of each electrode) without causing electrical shorting.

Each electrode of the capacitor 202 may be a conductive pillar that comprises, consists of, or consists essentially of conductive material. The conductive material may comprise, consist of, or consist essentially of a metal (e.g., copper, titanium, tungsten, cobalt, nickel, platinum, and/or ruthenium), a metal composition (e.g., a metal silicide, a metal carbide, and/or a metal nitride, such as titanium nitride or titanium silicon nitride), and/or a conductively-doped semiconductor material (e.g., conductively-doped silicon, conductively-doped germanium, and/or conductively-doped gallium arsenide), among other examples. In some implementations, each electrode comprises, consists of, or consists essentially of copper.

In some implementations, each electrode (e.g., each conductive pillar) may be formed by creating a stack of vias 228 (sometimes called a via stack) that is filled with conductive material, such as copper. For example, a primary electrode 224 of the example capacitor 202 shown in FIG. 2C may be formed by creating a via 228a through inner layer 214d, creating a via 228b through inner layer 214c, creating a via 228c through inner layer 214b, and creating a via 228d through inner layer 214a. Each via 228a, 228b, 228c, and 228d may extend through respective dielectric material 230 between adjacent inner layers. Similarly, a secondary electrode 226 of the example capacitor 202 shown in FIG. 2C may be formed by creating a via 228e through inner layer 214d, creating a via 228f through inner layer 214c, creating a via 228g through inner layer 214b, and creating a via 228h through inner layer 214a. Each via 228e, 228f, 228g, and 228h may extend through respective dielectric material 230 between adjacent inner layers. As shown, the vias 228a, 228b, 228c, and 228d of the primary electrode 224 may be substantially vertically aligned with one another to form a stack of vias, a pillar, or a via pillar. Similarly, the vias 228e, 228f, 228g, and 228h of the secondary electrode 226 may be substantially vertically aligned with one another to form a stack of vias, a pillar, or a via pillar. Thus, in contrast to the vias shown in connection with reference number 222, the vias 228 in a stack of vias are not connected by traces (e.g., on a layer between adjacent vias). Each via 228 in a stack of vias may be formed by drilling a hole in a corresponding layer and filling the hole with conductive material, thereby forming a conductive pillar from the stack of vias. Filling the vias 228 with a conductive material, rather than plating the holes (without entirely filling the holes) may result in improved performance of the capacitor 202, such as increased capacitance.

As shown, the electrodes of the capacitor 202 may be separated from one another by dielectric material 230. That is, all of the primary electrodes 224 may be separated from one another by the dielectric material 230, all of the secondary electrodes 226 may be separated from one another by the dielectric material 230, and all of the primary electrodes 224 may be separated from all of the secondary electrodes 226 by the dielectric material 230. A pair of neighboring opposite electrodes (e.g., a primary electrode 224 and a nearest secondary electrode 226 to the primary electrode 224) may form a single capacitor, and when multiple pairs of neighboring opposite electrodes are coupled as described herein (e.g., using a power plane and ground plane), the resulting structure may form the capacitor 202 having a capacitance that is the sum of the capacitances of all of the pairs of neighboring opposite electrodes.

In some implementations, the dielectric material 230 may comprise, consist of, or consist essentially of a composite material, such as a glass epoxy laminate (e.g., FR-4, which is a composite material comprising woven fiberglass cloth with an epoxy resin binder that is flame resistant), among other examples. In some implementations, the dielectric material 230 comprises, consists of, or consists essentially of a core of the substrate 204 and/or pre-impregnated material. The core of the substrate 204 may include a core material (e.g., FR-4) from which the apparatus is formed, such as by removing some of the core material from and/or adding other material to the substrate 204. Pre-impregnated material (sometimes called "pre-preg") may include a composite material made from pre-impregnated fibers (e.g., woven fibers) and a partially cured polymer matrix (e.g., epoxy, phenolic resin, or thermoplastic mixed with liquid rubbers or resins). Pre-impregnated material may be used to laminate a layer that includes core material and/or conductive material (e.g., copper). In some implementations, the dielectric material 230 includes a combination of a substrate core material and pre-impregnated material.

As further shown in FIGS. 2A-2C, the primary electrodes 224 may be coupled to a power plane 232. For example, the power plane 232 may be coupled with every primary electrode 224. Thus, the power plane 232 (e.g., a portion of the power plane 232) may be configured as a first terminal of the capacitor 202. In other words, a first terminal of the capacitor 202, that couples the primary electrodes 224 with one another, may be configured as a portion of the power plane 232. In some implementations, a portion of the power plane 232 that electrically couples the primary electrodes 224 with one another (and/or with the integrated circuit 206) is included in the primary layer 210. The power plane 232 may electrically connect the primary electrodes 224, the integrated circuit 206, and a power source, as described above and illustrated in connection with the circuit diagram of FIG. 1. For example, the power plane 232 may electrically couple the primary electrodes 224 to a power pin of the integrated circuit 206. In some implementations, the power plane 232 includes one or more electrical contacts (e.g., bond pads) configured to couple the primary electrodes 224 with the integrated circuit 206. Additionally, the power plane 232 may electrically connect the primary electrodes 224 to a power source (e.g., a positive terminal of the power source), such as via one or more power plane vias 234, an electrical contact of the secondary layer 212, a solder ball 220, and one or more external components.

As further shown, the secondary electrodes 226 may be coupled to a ground plane 236. For example, the ground plane 236 may be coupled with every secondary electrode 226. Thus, the ground plane 236 (e.g., a portion of the ground plane 236) may be configured as a second terminal of the capacitor 202. In other words, a second terminal of the capacitor 202, that couples the secondary electrodes 226 with one another, may be configured as a portion of the ground plane 236. In some implementations, a portion of the ground plane 236 that electrically couples the secondary electrodes 226 with one another (and/or with a solder ball 220) is included in the secondary layer 212. The ground plane 236 may electrically connect the secondary electrodes 226, the integrated circuit 206, and ground, as described above and illustrated in connection with the circuit diagram of FIG. 1. For example, the ground plane 236 may electrically couple the secondary electrodes 226 to a ground pin of the integrated circuit 206, such as via one or more ground plane vias 238 and an electrical contact of the primary layer 210. Additionally, the ground plane 236 may electrically connect the secondary electrodes 226 to ground (e.g., a negative terminal of the power source), such as via an electrical contact of the secondary layer 212, a solder ball 220, and one or more external components.

In the example apparatus 200 of FIGS. 2A-2C, the primary electrodes 224 are shown as being coupled with the power plane 232, and the secondary electrodes 226 are shown as being coupled with the ground plane 236. However, in some implementations, this configuration may be reversed. For example, the primary electrodes 224 may be coupled with the ground plane 236, which may couple the primary electrodes 224 with a ground pin of the integrated circuit 206 and with ground (e.g., a negative terminal of a power source), in a similar manner as described above. Similarly, the secondary electrodes 226 may be coupled with the power plane 232, which may couple the secondary electrodes 226 with a power pin of the integrated circuit 206 and with a power source (e.g., a positive terminal of a power source), in a similar manner as described above. In some cases, the power plane 232 and the ground plane 236 may each be referred to as a conductive plane, such as a first conductive plane (e.g., on the primary layer 210 and/or coupling the primary electrodes 224 with one another) and a second conductive plane (e.g., on the secondary layer 212 and/or coupling the secondary electrodes 226 with one another).

The power plane 232 and/or the ground plane 236 may comprise, consist of, or consist essentially of conductive material. The conductive material may comprise, consist of, or consist essentially of a metal (e.g., copper, titanium, tungsten, cobalt, nickel, platinum, and/or ruthenium), a metal composition (e.g., a metal silicide, a metal carbide, and/or a metal nitride, such as titanium nitride or titanium silicon nitride), and/or a conductively-doped semiconductor material (e.g., conductively-doped silicon, conductively-doped germanium, and/or conductively-doped gallium arsenide), among other examples. In some implementations, the power plane 232 and/or the ground plane 236 comprises, consists of, or consists essentially of copper. In some implementations, the power plane 232 may be a same material as or a different material than the ground plane 236.

As shown, the primary electrodes 224 may be separated from the ground plane 236 via the dielectric material 230, such as to prevent electrical shorting between the power plane 232 and the ground plane 236. Similarly, the secondary electrodes 226 may be separated from the power plane 232 via the dielectric material 230, such as to prevent electrical shorting between the power plane 232 and the ground plane 236.

In some implementations, the primary electrodes 224 are interleaved with the secondary electrodes 226. For example, primary electrodes 224 and secondary electrodes 226 may alternate in a particular direction. Additionally, or alternatively, the primary electrodes 224 and/or the secondary electrodes 226 may be arranged in a grid arrangement. For example, the primary electrodes 224 may be arranged in a first grid arrangement, the secondary electrodes 226 may be arranged in a second grid arrangement, and the first grid arrangement and the second grid arrangement may be offset from one another in one or more directions (e.g., to form a pattern of interleaved primary electrodes 224 and secondary electrodes 226). Additional details regarding the arrangement of the primary electrodes 224 and the secondary electrodes 226 are described in connection with FIGS. 3 and 4.

The primary electrodes 224, the secondary electrodes 226, a portion of the power plane 232 (e.g., configured as a first capacitor terminal), a portion of the ground plane 236 (e.g., configured as a second capacitor terminal), and the dielectric material 230 may form a capacitor 202, such as a decoupling capacitor. The capacitor 202 may be coupled with the integrated circuit 206 via the power plane 232 and the ground plane 236. Furthermore, the capacitor 202 may be coupled with a power source via the power plane 232 (e.g., coupled to a positive terminal of the power source) and the ground plane 236 (e.g., coupled to ground or to a negative terminal of the power source).

In some implementations, the apparatus 200 does not include (i.e., excludes) a decoupling capacitor, coupled with the integrated circuit 206, that is external from the substrate 204 or that includes a portion that is external from the substrate 204. For example, the capacitor 202 may be the only decoupling capacitor used for the integrated circuit 206. In this case, the apparatus 200 does not include a discrete decoupling capacitor (e.g., implemented as a discrete component of the apparatus 200) coupled to the integrated circuit 206. As a result of using the capacitor 202 described herein (rather than a decoupling capacitor that includes a portion external from the substrate 204), a size of the apparatus 200 may be reduced, a cost of the apparatus 200 may be reduced, there may be more flexibility in placement of the capacitor 202, the capacitor 202 may be placed closer to an integrated circuit 206 and/or relevant pins of the integrated circuit 206 (e.g., a power pin and/or a ground pin), and/or the effectiveness of the capacitor may be improved. As an example, a distance between the power pin of the integrated circuit 206 and an electrical contact on the power plane 232 (described in more detail below in connection with FIG. 3) may be less than or equal to approximately 350 microns.

Each of the illustrated x-axis, y-axis, and z-axis in FIGS. 2A-2C is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

As indicated above, FIGS. 2A-2C are provided as examples. Other examples may differ from what is described with regard to FIGS. 2A-2C.

Figure 3:
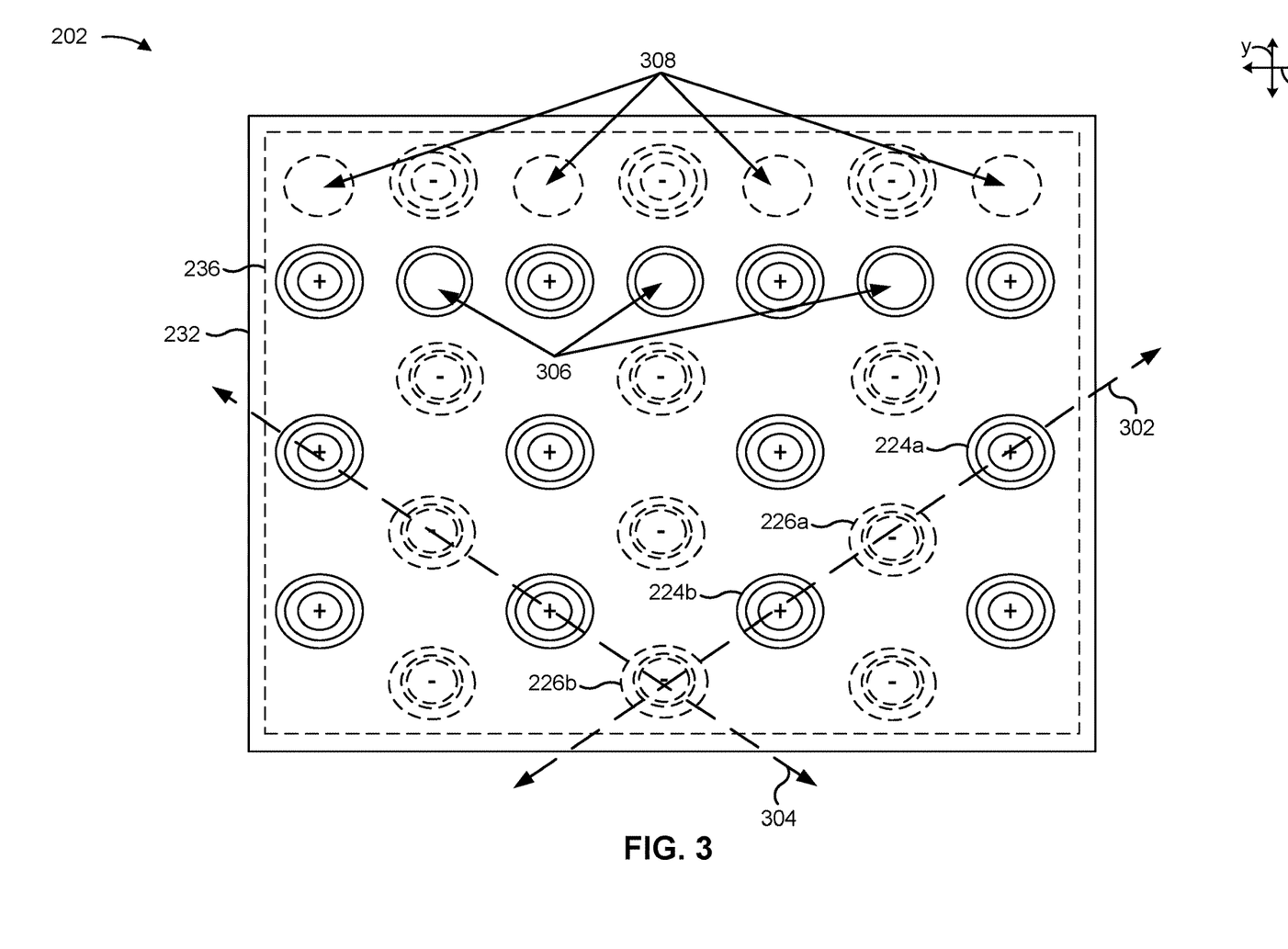
FIG. 3 is a top view of a portion of the capacitor including primary electrodes coupled to a power plane and secondary electrodes coupled to a ground plane.

FIG. 3 is a top view of a portion of the capacitor 202 including primary electrodes 224 coupled to a power plane 232 and secondary electrodes 226 coupled to a ground plane 236. In the top view of FIG. 3, the power plane 232 is overlaid on the ground plane 236. The ground plane 236 and elements coupled to the ground plane 236 are shown in dashed lines to indicate this overlay. In FIG. 3, the primary electrodes 224 are shown with a plus sign (+) to indicate that the primary electrodes 224 are coupled to a positive terminal of a power source via the power plane 232. The secondary electrodes 226 are shown with a minus sign (−) to indicate that the secondary electrodes 226 are coupled to a negative terminal of the power source (e.g., ground) via the ground plane 236.

As shown in FIG. 3, the secondary electrodes 226 are interleaved with the primary electrodes 224. For example, the primary electrodes 224 and the secondary electrodes 226 may alternate in a particular direction, such as along the line 302. Along the line 302, there is a first primary electrode 224a, then a first secondary electrode 226a, then a second primary electrode 224b, then a second secondary electrode 226b, and so on (i.e., extending further along the line 302 on a portion of the capacitor 202 not shown in FIG. 3). The primary electrodes 224 and the secondary electrodes also alternate along the line 304, along lines of electrodes parallel to line 302, and along lines of electrodes parallel to line 304.

In some implementations, the primary electrodes 224 may be arranged in a first grid arrangement, where the primary electrodes 224 are present at intersections of first gridlines of a first grid. Similarly, the secondary electrodes 226 may be arranged in a second grid arrangement, where the primary electrodes 224 are present at intersections of second gridlines of a second grid. The first grid arrangement and the second grid arrangement may be offset from one another in one or more directions, such as the illustrated x direction and the illustrated y direction. Additional details regarding grid arrangements of the primary electrodes 224 and the secondary electrodes 226 are described in connection with FIG. 4.

In some implementations, one or more electrical contacts 306 may be disposed on the power plane 232 (e.g., on a top surface of the power plane 232). The one or more electrical contacts 306 may be configured to couple the power plane 232 (and thus, the primary electrodes 224) with the integrated circuit 206 (not shown in FIG. 3) and/or a power source. As shown, in some implementations, the one or more electrical contacts 306 (e.g., multiple electrical contacts 306) may be substantially aligned with a row of primary electrodes 224 (e.g., a row of the first grid arrangement) on a surface of the power plane 232.

Additionally, or alternatively, one or more electrical contacts 308 may be disposed on the ground plane 236 (e.g., on a bottom surface of the ground plane 236). The one or more electrical contacts 308 may be configured to couple the ground plane 236 (and thus, the secondary electrodes 226) with the integrated circuit 206 (not shown in FIG. 3) and/or ground. As shown, in some implementations, the one or more electrical contacts 308 (e.g., multiple electrical contacts 308) may be substantially aligned with a row of secondary electrodes 226 (e.g., a row of the second grid arrangement) on a surface of the ground plane 236.

An electrical contact 306 and/or an electrical contact 308 may include a surface area that is configured for electrical contact with a separate component (e.g., separate from the substrate 204). For example, an electrical contact 306 and/or an electrical contact 308 may include a pad, such as a contact pad, a bond pad, a die pad, a bump pad, or the like. In some implementations, an electrical contact 306 and/or an electrical contact 308 is coated with a conductive material, such as gold or a gold alloy, to facilitate bonding of components (e.g., via a solder joint, a wire bond, or the like).

The quantity of electrodes shown in FIG. 3 represent a portion of the capacitor 202. In practice, the capacitor 202 may include more electrodes than the quantity shown in FIG. 3. For example, the capacitor 202 may include more than 150 electrodes, more than 175 electrodes, more than 200 electrodes, and so on. In some implementations, the capacitor 202 may include an equal quantity of primary electrodes 224 and secondary electrodes 226. Alternatively, the capacitor 202 may include different quantities of primary electrodes 224 and secondary electrodes 226. For example, the capacitor 202 may include 110 primary electrodes 224 (e.g., coupled to the power plane 232) and may include 100 secondary electrodes 226 (e.g., coupled to the ground plane 236). In some implementations, the capacitor 202 may include a greater quantity of electrodes coupled to the power plane 232 (e.g., primary electrodes 224 in the example capacitor 202) than a quantity of electrodes coupled to the ground plane 236 (e.g., secondary electrodes 226 in the example capacitor 202). This may improve a capability of the capacitor 202 to supply extra voltage to the integrated circuit 206 via the primary electrodes 224 and the power plane 232.

In some implementations, a size of the capacitor 202 may be approximately 4,000 microns (e.g., in the x direction) by approximately 1,800 microns (e.g., in they direction). In some implementations, electrodes at the edge of the capacitor 202 may be approximately 50 microns from the edge of the capacitor 202. A height of the capacitor 202 may be based on a height of the substrate 204. For example, for a substrate 204 with six layers (a primary layer, a secondary layer, and four inner layers), the capacitor 202 may have a height of approximately 224 microns. As another example, for a substrate 204 with four layers (a primary layer, a secondary layer, and two inner layers), the capacitor 202 may have a height of approximately 160 microns. A height of a via 228 may be based on a height of the layer through which the via is formed.

In some implementations, one or more of the above dimensions or quantities may be modified to achieve a desired capacitance of the capacitor 202. For example, a capacitance of the capacitor 202 may depend on a quantity of electrodes included in the capacitor 202, a dimension of the capacitor 202 (e.g., a length, width, or height of the capacitor 202), a thickness of each layer (e.g., the primary layer, the secondary layer, and each inner layer) and a corresponding height of each via 228 (and each via stack or electrode), and/or a depth to which holes are drilled and corresponding electrodes are formed in the substrate 204.

As indicated above, FIG. 3 is provided as an example. Other examples may differ from what is described with regard to FIG. 3.

Figure 4:
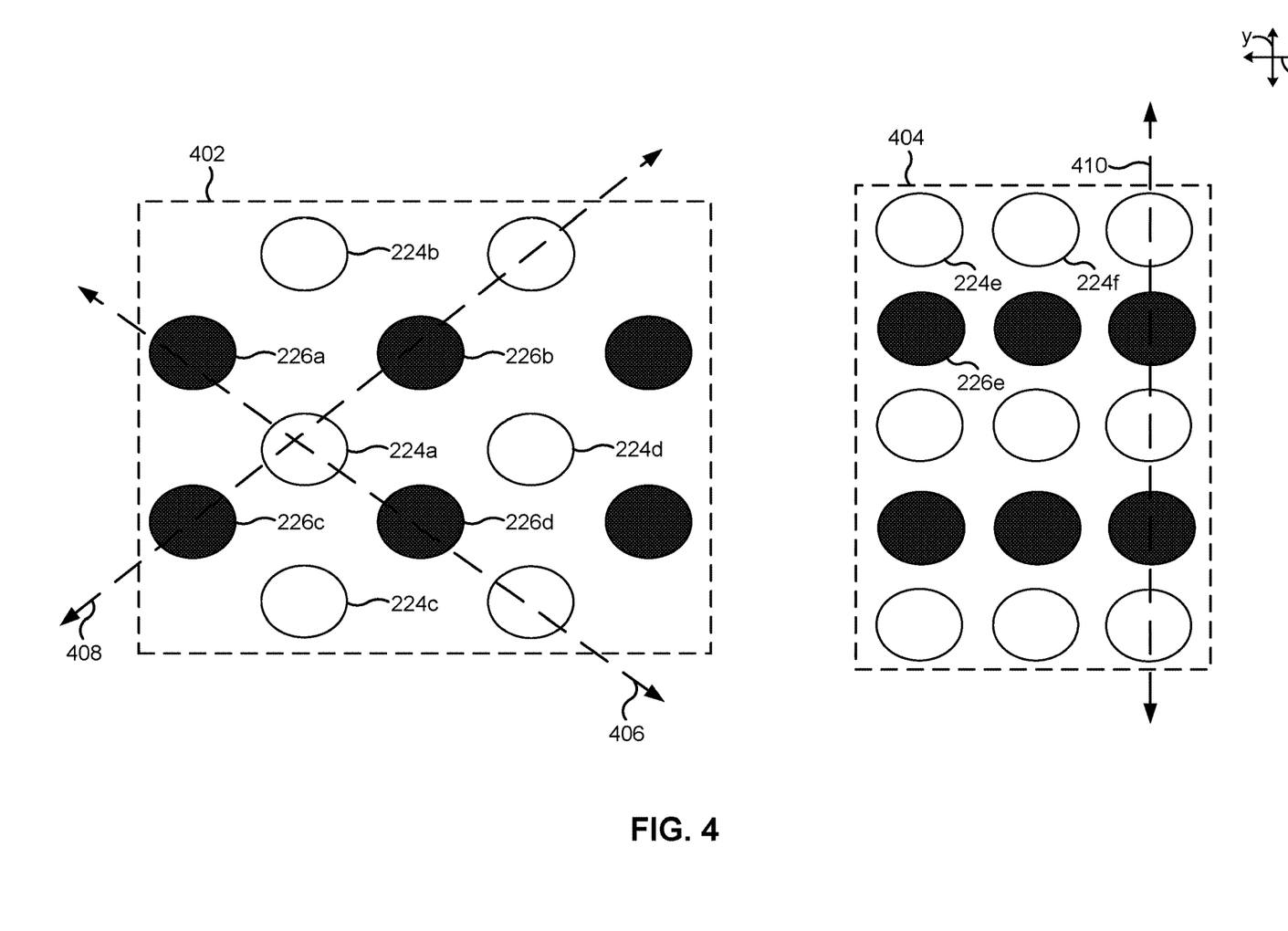
FIG. 4 is a diagram of example configurations of primary electrodes and secondary electrodes in a capacitor having electrodes formed within a substrate.

FIG. 4 is a diagram of example configurations of primary electrodes 224 and secondary electrodes 226 in a capacitor 202 having electrodes formed within a substrate. FIG. 4 shows a first configuration 402 and a second configuration 404. However, other configurations are contemplated. In FIG. 4, the primary electrodes 224 are shown in white, and the secondary electrodes 226 are shown in black.

As shown in FIG. 4, the secondary electrodes 226 are interleaved with the primary electrodes 224 in both the first configuration 402 and the second configuration 404. For example, in the first configuration 402, the primary electrodes 224 and the secondary electrodes 226 alternate along the line 406, along the line 408, along lines of electrodes parallel to the line 406, and along lines of electrodes parallel to the line 408, in a similar manner as described above in connection with FIG. 3. In the second configuration 404, the primary electrodes 224 and the secondary electrodes 226 alternate along the line 410 (as well as lines of electrodes parallel to the line 410).

As described above in connection with FIG. 3, the primary electrodes 224 may be arranged in a first grid arrangement, where the primary electrodes 224 are present at intersections of first gridlines of a first grid. Similarly, the secondary electrodes 226 may be arranged in a second grid arrangement, where the primary electrodes 224 are present at intersections of second gridlines of a second grid. The first grid arrangement and the second grid arrangement may be offset from one another. In the first configuration 402, the second grid arrangement is offset from the first grid arrangement in the illustrated x direction and the illustrated y direction. In the second configuration 404, the second grid arrangement is offset from the first grid arrangement in a single direction, shown as they direction.

In some implementations, such as the first configuration 402, a first distance between a first type of electrode and the nearest second type of electrode is less than a second distance between nearest electrodes of the same type. For example, a distance between primary electrode 224a and secondary electrode 226a (as well as a distance between primary electrode 224a and secondary electrode 226b, secondary electrode 226c, or secondary electrode 226d) is less than a distance between primary electrode 224a and primary electrode 224b (as well as a distance between primary electrode 224a and primary electrode 224c or primary electrode 224d).

In some implementations, such as the second configuration 404, all of the electrodes are substantially equidistant to their nearest electrode neighbor, regardless of electrode type. For example, primary electrode 224e is substantially equidistant from primary electrode 224f and secondary electrode 226e. Thus, a distance between nearest electrodes of different types (e.g., a primary electrode 224 and a secondary electrode 226) may be less than or equal to a distance between nearest electrodes of the same type (e.g., two primary electrodes 224 or two secondary electrodes 226). This may result in improved capacitor performance.

As indicated above, FIG. 4 is provided as an example. Other examples may differ from what is described with regard to FIG. 4.

Figure 5:
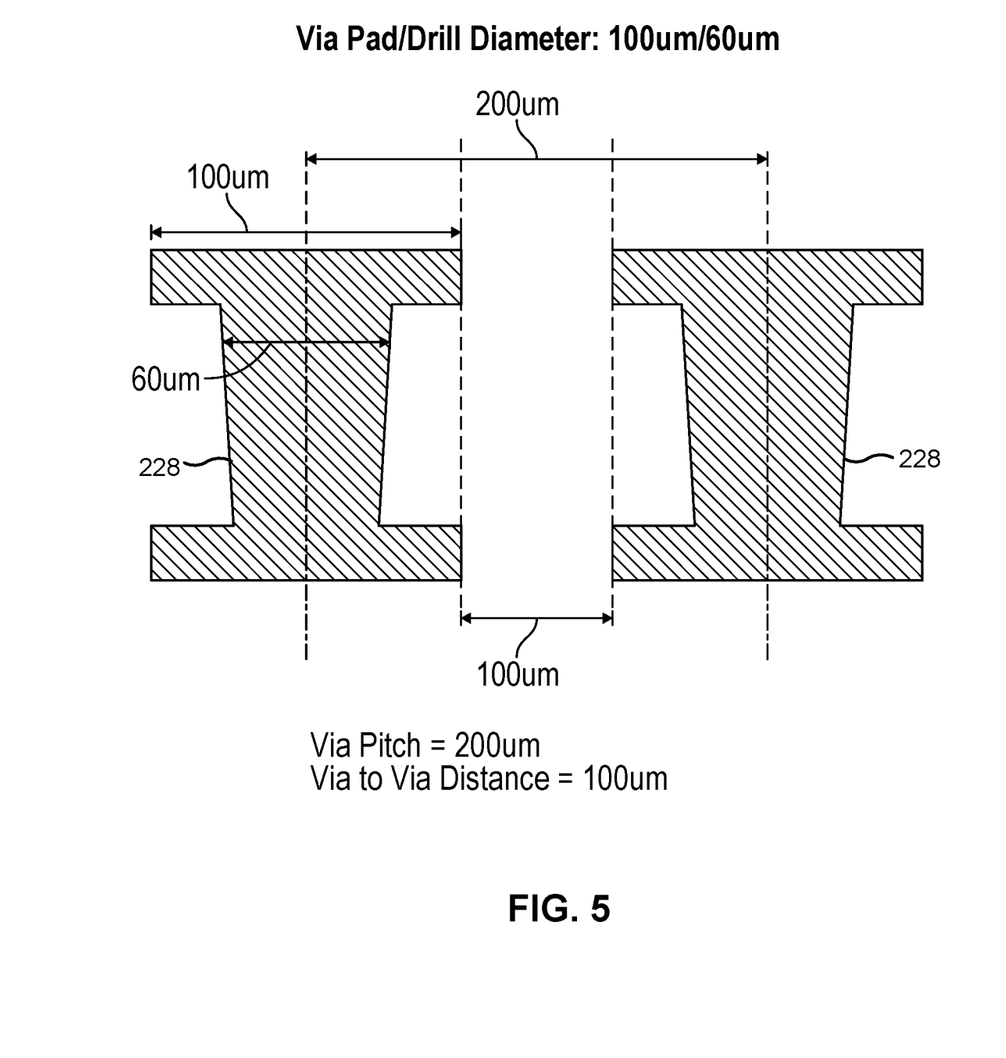
FIG. 5 is a diagram of example dimensions associated with a capacitor having electrodes formed within a substrate.

FIG. 5 is a diagram of example dimensions associated with a capacitor 202 having electrodes formed within a substrate. For example, FIG. 5 shows example dimensions associated with vias 228.

As shown in FIG. 5, in some implementations, a via pad of a via 228 may have a diameter of approximately 100 microns. Alternatively, the via pad may have a diameter of less than 100 microns, such as approximately 90 microns. In some implementations, a drill diameter associated with a via 228 (e.g., a diameter of a hole through a layer, which may then be filled with conductive material) may be approximately 60 microns. Alternatively, the drill diameter may be less than 60 microns, such as approximately 50 microns. In some implementations, a via pitch (e.g., a distance between the center of adjacent vias 228) may be approximately 200 microns. In some implementations, a via-to-via distance (e.g., a distance between via pads of adjacent vias) may be approximately 100 microns.

In some implementations, one or more of the above dimensions may be modified to achieve a desired capacitance of the capacitor 202. For example, a capacitance of the capacitor 202 may depend on a diameter of each via pad, a drill diameter, a via pitch, and/or a via-to-via distance.

As indicated above, FIG. 5 is provided as an example. Other examples may differ from what is described with regard to FIG. 5.

Figure 6:
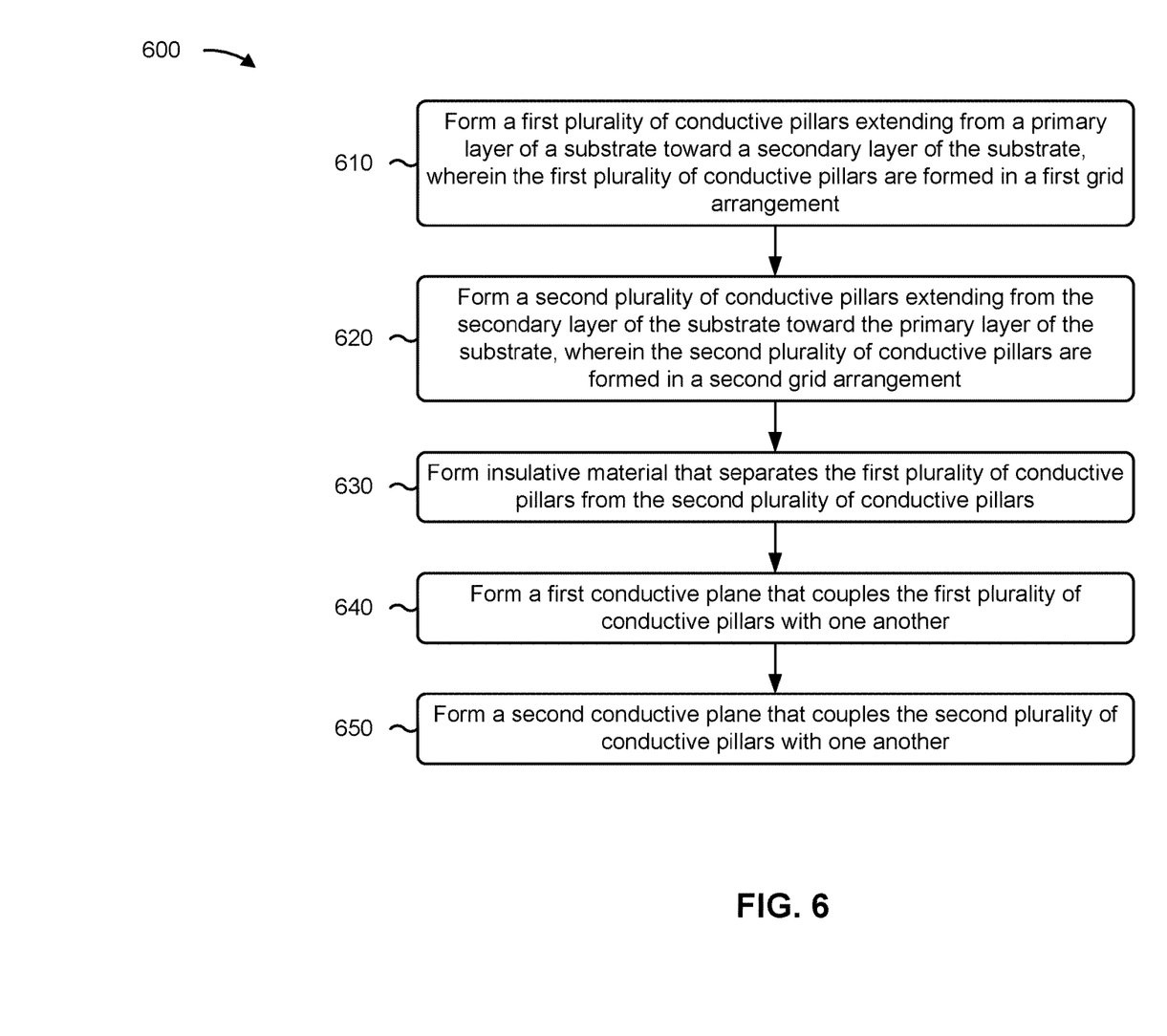
FIG. 6 is a flowchart of an example method of forming an integrated assembly or apparatus with a capacitor having electrodes formed within a substrate.

FIG. 6 is a flowchart of an example method 600 of forming an integrated assembly or apparatus with a capacitor having electrodes formed within a substrate. In some implementations, one or more process blocks of FIG. 6 may be performed by various semiconductor manufacturing equipment.

As shown in FIG. 6, the method 600 may include forming a first plurality of conductive pillars extending from a primary layer of a substrate toward a secondary layer of the substrate, wherein the first plurality of conductive pillars are formed in a first grid arrangement (block 610). As further shown in FIG. 6, the method 600 may include forming a second plurality of conductive pillars extending from the secondary layer of the substrate toward the primary layer of the substrate, wherein the second plurality of conductive pillars are formed in a second grid arrangement (block 620). As further shown in FIG. 6, the method 600 may include forming dielectric material that separates the first plurality of conductive pillars from the second plurality of conductive pillars (block 630). As further shown in FIG. 6, the method 600 may include forming a first conductive plane that couples the first plurality of conductive pillars with one another (block 640). As further shown in FIG. 6, the method 600 may include forming a second conductive plane that couples the second plurality of conductive pillars with one another (block 650).

The method 600 may include additional implementations, such as any single implementation or any combination of implementations described below and/or in connection with one or more other methods described elsewhere herein.

In some implementations, the first grid arrangement is offset from the second grid arrangement in at least one direction.

In some implementations, the method 600 includes placing an integrated circuit on the substrate, coupling the integrated circuit with the first plurality of conductive pillars via the first conductive plane, and coupling the integrated circuit with the second plurality of conductive pillars via the second conductive plane.

In some implementations, forming the first plurality of conductive pillars includes drilling a hole, for each conductive pillar of the first plurality of conductive pillars, through the primary layer and through each inner layer between the primary layer and the secondary layer and filling the hole, for each conductive pillar of the first plurality of conductive pillars, with conductive material. In some implementations, forming the second plurality of conductive pillars comprises drilling a hole, for each conductive pillar of the second plurality of conductive pillars, through the secondary layer and through each inner layer between the primary layer and the secondary layer and filling the hole, for each conductive pillar of the second plurality of conductive pillars, with conductive material.

In some implementations, forming a conductive pillar comprises drilling a via and depositing conductive material to fill up the via. In some implementations, forming a conductive pillar comprises forming a via using laser via technology and depositing conductive material to fill up the via.

Although FIG. 6 shows example blocks of the method 600, in some implementations, the method 600 may include additional blocks, fewer blocks, different blocks, or differently arranged blocks than those depicted in FIG. 6. In some implementations, the method 600 may include forming the capacitor 202, the apparatus 200, an integrated assembly included in the capacitor 202 and/or the apparatus 200, any part described herein of the capacitor 202, and/or any part described herein of an integrated assembly included in the capacitor 202. For example, the method 600 may include forming one or more of the parts 200-220 and/or 224-238.

Figure 7:
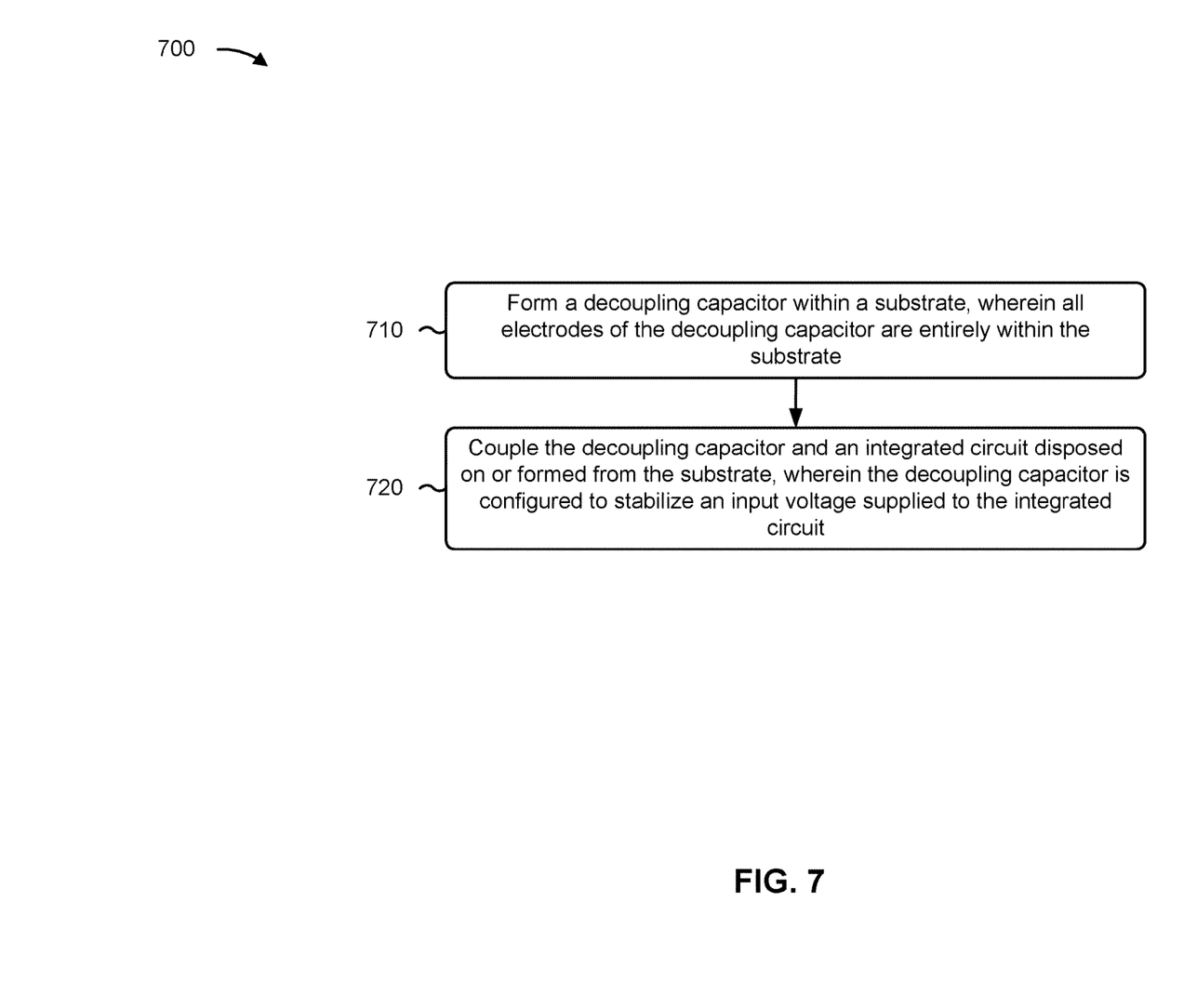
FIG. 7 is a flowchart of another example method of forming an integrated assembly or apparatus with a capacitor having electrodes formed within a substrate.

FIG. 7 is a flowchart of an example method 700 of forming an integrated assembly or apparatus with a capacitor having electrodes formed within a substrate. In some implementations, one or more process blocks of FIG. 7 may be performed by various semiconductor manufacturing equipment.

As shown in FIG. 7, the method 700 may include forming a decoupling capacitor within a substrate, wherein all electrodes of the decoupling capacitor are entirely within the substrate (block 710). For example, the method 700 may include forming the decoupling capacitor 202 described herein.

As further shown in FIG. 7, the method 700 may include coupling the decoupling capacitor and an integrated circuit disposed on or formed from the substrate, wherein the decoupling capacitor is configured to stabilize an input voltage supplied to the integrated circuit (block 720). For example, the method 700 may include coupling the decoupling capacitor 202 and the integrated circuit 206 described herein.

The method 700 may include additional implementations, such as any single implementation or any combination of implementations described below and/or in connection with one or more other methods described elsewhere herein.

In some implementations, the method 700 includes disposing one or more other components on the substrate. For example, the method 700 may include disposing one or more components 208 (described elsewhere herein) on the substrate 204 or forming one or more components 208 from the substrate 204. In this way, the method 700 may include forming the apparatus 200 described herein.

Although FIG. 7 shows example blocks of the method 700, in some implementations, the method 700 may include additional blocks, fewer blocks, different blocks, or differently arranged blocks than those depicted in FIG. 7. In some implementations, the method 700 may include forming the capacitor 202, the apparatus 200, an integrated assembly included in the capacitor 202 and/or the apparatus 200, any part described herein of the capacitor 202, and/or any part described herein of an integrated assembly included in the capacitor 202. For example, the method 700 may include forming one or more of the parts 200-220 and/or 224-238.

In some implementations, an apparatus includes a substrate; a primary layer of the substrate; a secondary layer of the substrate that is on an opposite side of the substrate with respect to the primary layer; and a capacitor, comprising: a first plurality of via stacks, arranged in a first grid arrangement, that each extend through the primary layer to a first inner layer of the substrate between the primary layer and the secondary layer; a second plurality of via stacks, arranged in a second grid arrangement, that each extend through the secondary layer to a second inner layer of the substrate between the primary layer and the secondary layer; and dielectric material separating every via stack included in the first plurality of via stacks from every via stack included in the second plurality of via stacks.

In some implementations, an apparatus includes a substrate having a first surface and a second surface that is on an opposite side of the substrate with respect to the first surface; an integrated circuit disposed on the substrate; and a decoupling capacitor configured to stabilize an input voltage supplied to the integrated circuit, wherein all electrodes of the decoupling capacitor are entirely within a region between the first surface and the second surface.

In some implementations, a substrate includes a primary layer on a first side of the substrate; a secondary layer on a second side of the substrate that is opposite the first side; a first plurality of via pillars configured as first electrodes of a capacitor and positioned between the primary layer and the secondary layer; a second plurality of via pillars configured as second electrodes of the capacitor and positioned between the primary layer and the secondary layer; and at least one dielectric material arranged to: separate the first plurality of via pillars from one another, separate the second plurality of via pillars from one another, and separate the first plurality of via pillars from the second plurality of via pillars.

In some implementations, an integrated assembly includes a first plurality of pillars extending from a primary layer of a substrate toward a secondary layer of the substrate, wherein each pillar, included in the first plurality of pillars, comprises a stack of vias filled with conductive material; a second plurality of pillars extending from the secondary layer of the substrate toward the primary layer of the substrate, wherein each pillar, included in the second plurality of pillars, comprises a stack of vias filled with conductive material, wherein the second plurality of pillars are interleaved with the first plurality of pillars, wherein the second plurality of pillars are separated from the first plurality of pillars by dielectric material; a first conductive plane on the primary layer and coupled with the first plurality of pillars; and a second conductive plane on the secondary layer and coupled with the second plurality of pillars.

In some implementations, a method includes forming a first plurality of conductive pillars extending from a primary layer of a substrate toward a secondary layer of the substrate, wherein the first plurality of conductive pillars are formed in a first grid arrangement; forming a second plurality of conductive pillars extending from the secondary layer of the substrate toward the primary layer of the substrate, wherein the second plurality of conductive pillars are formed in a second grid arrangement; forming dielectric material that separates the first plurality of conductive pillars from the second plurality of conductive pillars; forming a first conductive plane that couples the first plurality of conductive pillars with one another; and forming a second conductive plane that couples the second plurality of conductive pillars with one another.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement."

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. An apparatus, comprising:
   a substrate;
   a primary layer of the substrate;
   a secondary layer of the substrate that is on an opposite side of the substrate with respect to the primary layer; and
   a capacitor, comprising:
      a first plurality of via stacks, arranged in a first grid arrangement, that each extend from the primary layer to a first inner layer of the substrate between the primary layer and the secondary layer;

a second plurality of via stacks, arranged in a second grid arrangement, that each extend from the secondary layer to a second inner layer of the substrate between the primary layer and the secondary layer; and dielectric material separating every via stack included in the first plurality of via stacks from every via stack included in the second plurality of via stacks.

2. The apparatus of claim 1, further comprising a power plane coupled with the first plurality of via stacks, wherein the power plane is configured as a first terminal of the capacitor.

3. The apparatus of claim 1, further comprising a ground plane coupled with the second plurality of via stacks, wherein the ground plane is configured as a second terminal of the capacitor.

4. The apparatus of claim 1, wherein the first plurality of via stacks are coupled with an integrated circuit, disposed on the substrate, via a power plane.

5. The apparatus of claim 4, wherein the capacitor is a decoupling capacitor configured to stabilize an input voltage, supplied to the integrated circuit, by storing a charge.

6. The apparatus of claim 4, further comprising one or more electrical contacts, disposed on the power plane, configured to couple the first plurality of via stacks with the integrated circuit, wherein the one or more electrical contacts are substantially aligned with a row of the first grid arrangement.

7. The apparatus of claim 1, wherein the first inner layer is adjacent to the secondary layer.

8. The apparatus of claim 1, wherein the second inner layer is adjacent to the primary layer.

9. The apparatus of claim 1, wherein the first plurality of via stacks and the second plurality of via stacks are filled with conductive material.

10. The apparatus of claim 1, wherein the dielectric material comprises at least one of a core of the substrate or pre-impregnated material.

11. The apparatus of claim 1, wherein the first grid arrangement of the first plurality of via stacks is offset from the second grid arrangement of the second plurality of via stacks in one or more directions.

12. The apparatus of claim 1, further comprising an integrated circuit coupled to the capacitor, wherein the apparatus does not include a decoupling capacitor, for the integrated circuit, external from the substrate.

13. A substrate, comprising:
a primary layer on a first side of the substrate;
a secondary layer on a second side of the substrate that is opposite the first side;
a first plurality of via pillars configured as first electrodes of a capacitor and positioned between the primary layer and the secondary layer;
a second plurality of via pillars configured as second electrodes of the capacitor and positioned between the primary layer and the secondary layer; and
at least one dielectric material arranged to:
separate the first plurality of via pillars from one another,
separate the second plurality of via pillars from one another, and
separate the first plurality of via pillars from the second plurality of via pillars.

14. The substrate of claim 13, further comprising:
a power plane coupled to the first plurality of via pillars; and a ground plane coupled to the second plurality of via pillars.

15. The substrate of claim 14, wherein the power plane is configured as a first terminal of the capacitor and the ground plane is configured as a second terminal of the capacitor.

16. The substrate of claim 14, wherein the first plurality of via pillars are coupled to an integrated circuit, disposed on the substrate, via the power plane, and wherein the second plurality of via pillars are coupled to the integrated circuit via the ground plane.

17. The substrate of claim 13, wherein the first plurality of via pillars extend from the primary layer to a first inner layer of the substrate, and wherein the second plurality of via pillars extend from the secondary layer to a second inner layer of the substrate.

18. The substrate of claim 13, wherein the first plurality of via pillars are arranged in a first grid arrangement, wherein the second plurality of via pillars are arranged in a second grid arrangement, and wherein the first grid arrangement is offset from the second grid arrangement in at least one direction.

19. An integrated assembly, comprising:
a first plurality of pillars extending from a primary layer of a substrate toward a secondary layer of the substrate,
wherein each pillar, included in the first plurality of pillars, comprises a stack of vias filled with conductive material;
a second plurality of pillars extending from the secondary layer of the substrate toward the primary layer of the substrate,
wherein each pillar, included in the second plurality of pillars, comprises a stack of vias filled with conductive material,
wherein the second plurality of pillars are interleaved with the first plurality of pillars,
wherein the second plurality of pillars are separated from the first plurality of pillars by dielectric material;
a first conductive plane on the primary layer and coupled with the first plurality of pillars; and
a second conductive plane on the secondary layer and coupled with the second plurality of pillars.

20. The integrated assembly of claim 19, wherein the first plurality of pillars are separated from the second conductive plane by the dielectric material, and wherein the second plurality of pillars are separated from the first conductive plane by the dielectric material.

21. The integrated assembly of claim 19, wherein the first plurality of pillars, the second plurality of pillars, a portion of the first conductive plane, a portion of the second conductive plane, and the dielectric material form a decoupling capacitor that is coupled with an integrated circuit via the first conductive plane and the second conductive plane.

22. The integrated assembly of claim 19, wherein the first plurality of pillars extend from the primary layer to an inner layer of the substrate, and wherein the second plurality of pillars extend from the secondary layer to an inner layer of the substrate.

23. The integrated assembly of claim 19, wherein the first plurality of pillars are arranged in a first grid arrangement, and wherein the second plurality of pillars are arranged in a second grid arrangement.

24. A method, comprising:
forming a first plurality of conductive pillars extending from a primary layer of a substrate toward a secondary layer of the substrate, wherein the first plurality of conductive pillars are formed in a first grid arrangement;

forming a second plurality of conductive pillars extending from the secondary layer of the substrate toward the primary layer of the substrate, wherein the second plurality of conductive pillars are formed in a second grid arrangement;

forming dielectric material that separates the first plurality of conductive pillars from the second plurality of conductive pillars;

forming a first conductive plane that couples the first plurality of conductive pillars with one another; and forming a second conductive plane that couples the second plurality of conductive pillars with one another.

25. The method of claim 24, wherein the first grid arrangement is offset from the second grid arrangement in at least one direction.

26. The method of claim 24, further comprising:
placing an integrated circuit on the substrate;
coupling the integrated circuit with the first plurality of conductive pillars via the first conductive plane; and
coupling the integrated circuit with the second plurality of conductive pillars via the second conductive plane.

27. The method of claim 24, wherein forming the first plurality of conductive pillars comprises:
drilling a hole, for each conductive pillar of the first plurality of conductive pillars, through each inner layer between the primary layer and the secondary layer; and
filling the hole, for each conductive pillar of the first plurality of conductive pillars, with conductive material; and
wherein forming the second plurality of conductive pillars comprises:
drilling a hole, for each conductive pillar of the second plurality of conductive pillars, through each inner layer between the primary layer and the secondary layer; and
filling the hole, for each conductive pillar of the second plurality of conductive pillars, with conductive material.

* * * * *